(12) United States Patent
Kang et al.

(10) Patent No.: US 10,395,755 B2
(45) Date of Patent: Aug. 27, 2019

(54) STACKED MEMORY DEVICE USING BASE DIE SPARE CELL AND METHOD OF REPAIRING THE SAME

(71) Applicant: INDUSTRY-ACADEMIC COOPERATION FOUNDATION, YONSEI UNIVERSITY, Seoul (KR)

(72) Inventors: Sungho Kang, Seoul (KR); Dong Hyun Han, Seoul (KR)

(73) Assignee: INDUSTRY-ACADEMIC COOPERATION FOUNDATION, YONSEI UNIVERSITY, Seoul (KR)

(*) Notice: Subject to any disclaimer, the term of this patent is extended or adjusted under 35 U.S.C. 154(b) by 0 days.

(21) Appl. No.: 15/988,970

(22) Filed: May 24, 2018

(65) Prior Publication Data

US 2019/0180840 A1 Jun. 13, 2019

(30) Foreign Application Priority Data

Dec. 12, 2017 (KR) .................. 10-2017-0170045

(51) Int. Cl.
*G11C 15/00* (2006.01)
*G11C 29/00* (2006.01)

(52) U.S. Cl.
CPC .................................. *G11C 29/72* (2013.01)

(58) Field of Classification Search
CPC . G11C 16/0483; G11C 16/26; G11C 11/5642; G11C 16/3427; G11C 16/10; G11C 16/3418; G11C 16/24; G11C 16/3454; G11C 16/08; G11C 16/3431; G11C 11/5628; G11C 16/32
USPC .... 365/185.18, 222, 189.14, 230.03, 185.03, 365/210.1, 185.09, 185.11, 185.12, 365/185.25
See application file for complete search history.

(56) References Cited

U.S. PATENT DOCUMENTS

2014/0376320 A1* 12/2014 Loh ..................... G11O 29/76
365/200

FOREIGN PATENT DOCUMENTS

KR 10-1545716 B1 8/2015
KR 10-1652874 B1 9/2016

* cited by examiner

*Primary Examiner* — Thong Q Le

(57) ABSTRACT

Disclosed are a stacked memory device and a method of repairing the same, in which spare cells for a post-bond test and repair process are disposed in a base die and the spare cells are used in each memory layer as many as the number desired, a repair result after the test is permanently stored, and the spare cell of the base die and the memory layer are simultaneously approached and meaningful data is selected, so that it is not necessary to newly perform a test even though power of a memory is blocked, it is possible to solve time wasted during an approach to a memory layer after a spare memory performs determination, and it is possible to secure a high repair rate.

18 Claims, 7 Drawing Sheets

[FIG. 1]
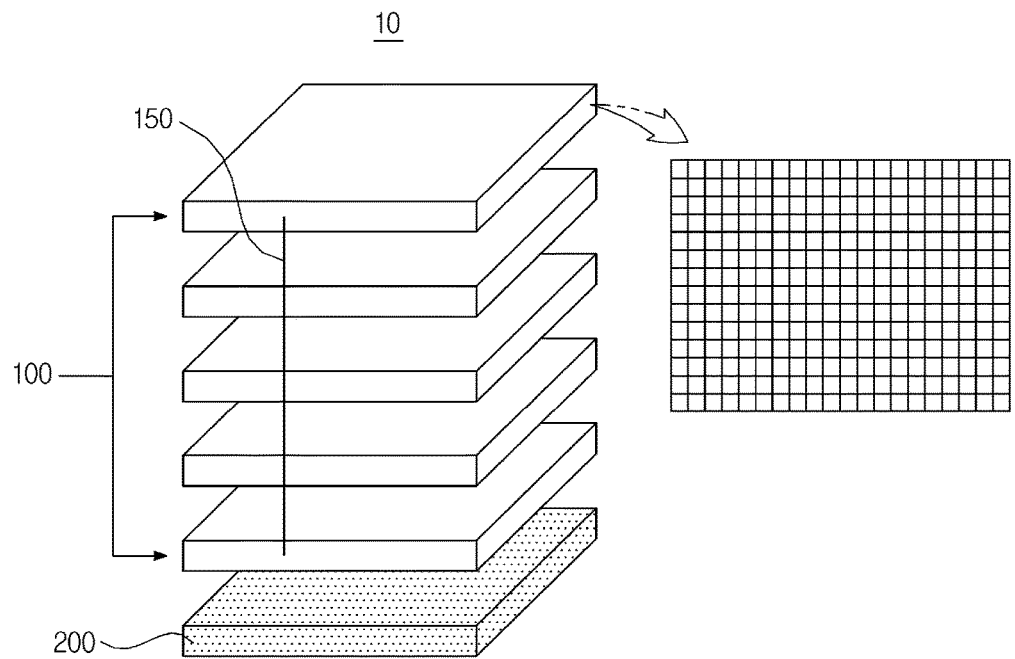
[FIG. 2]
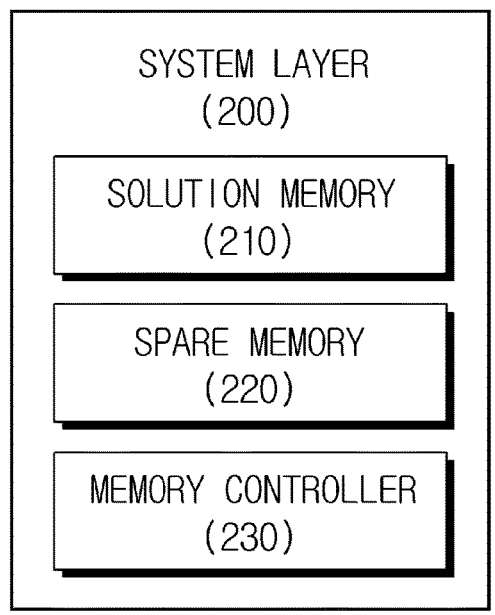

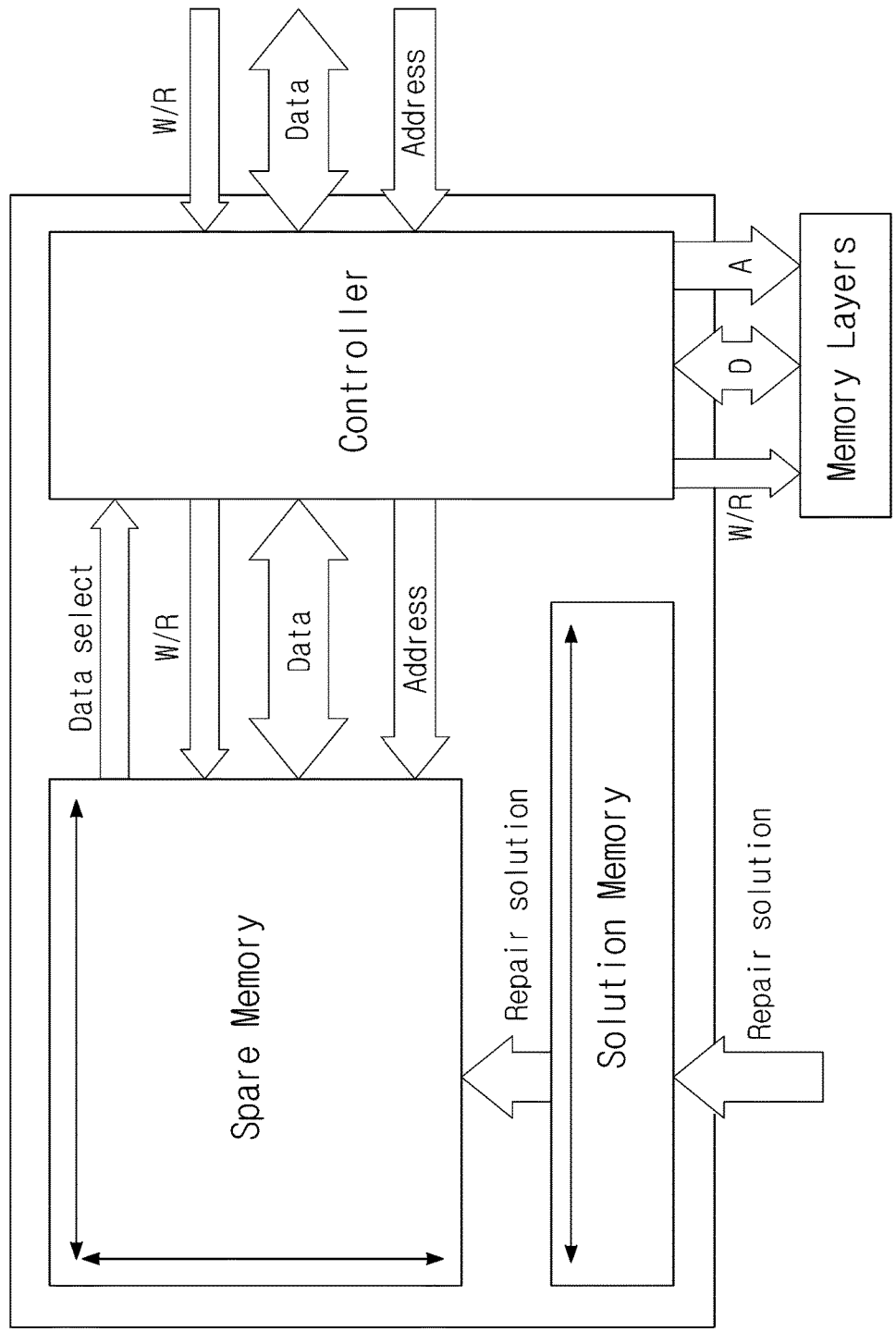
[FIG.3]

[FIG. 4]
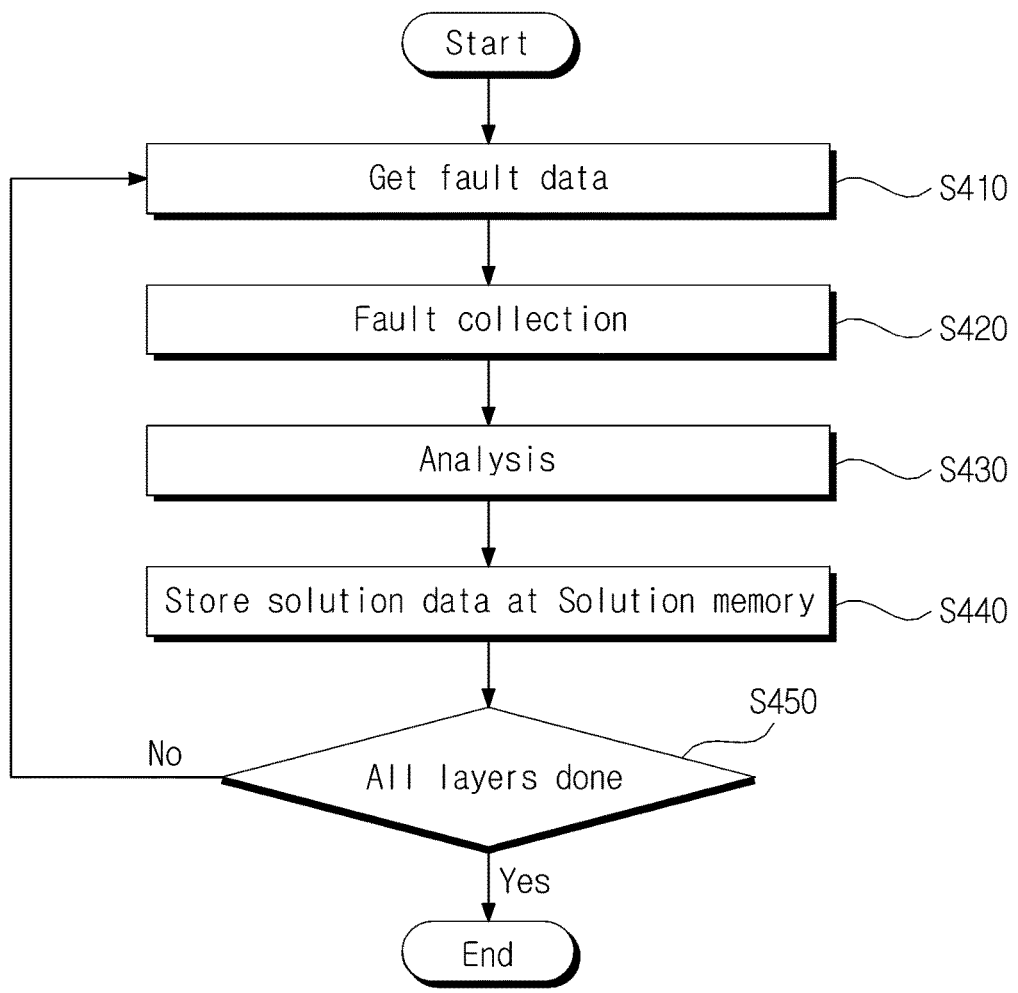

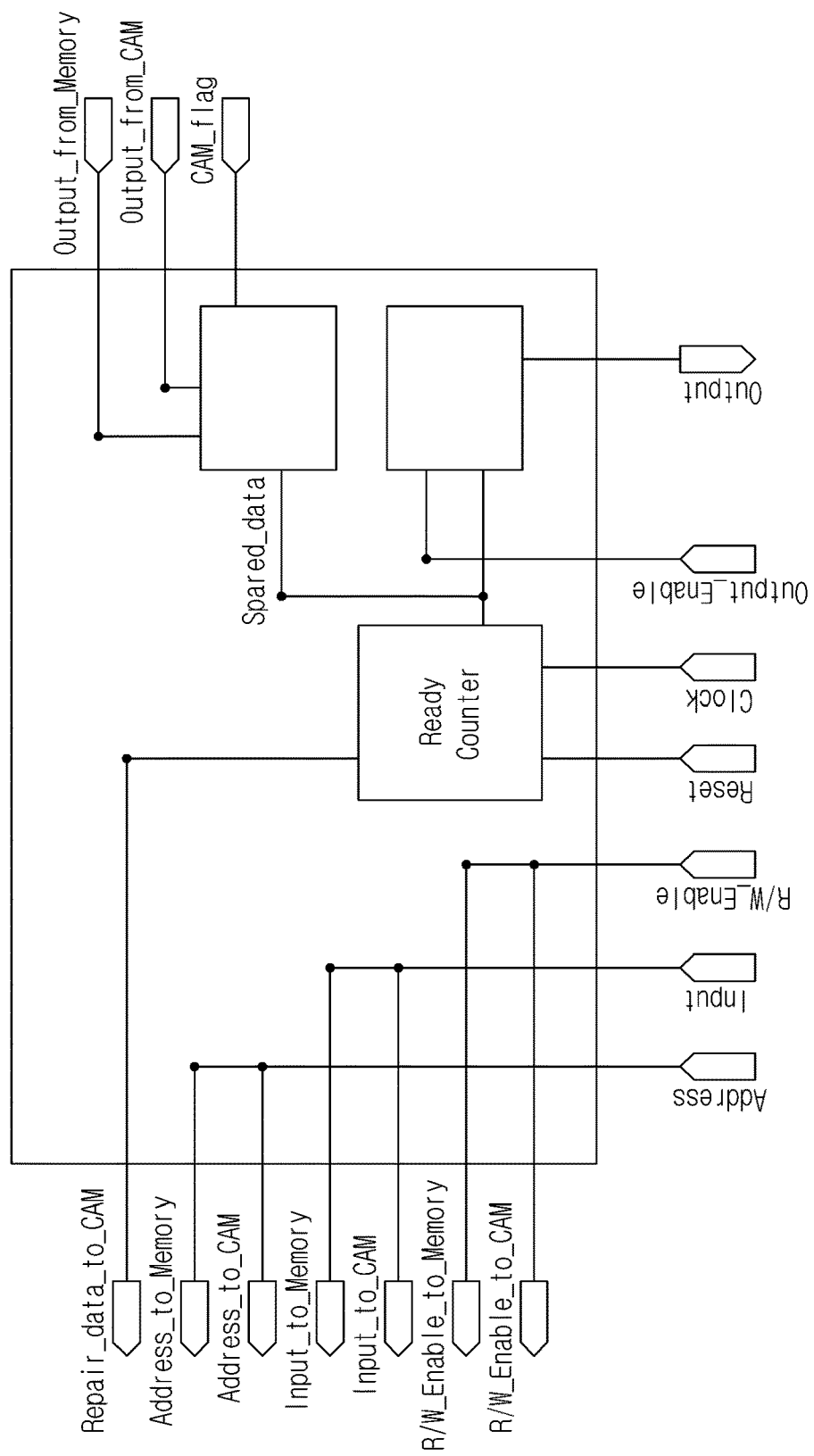
[FIG. 5]

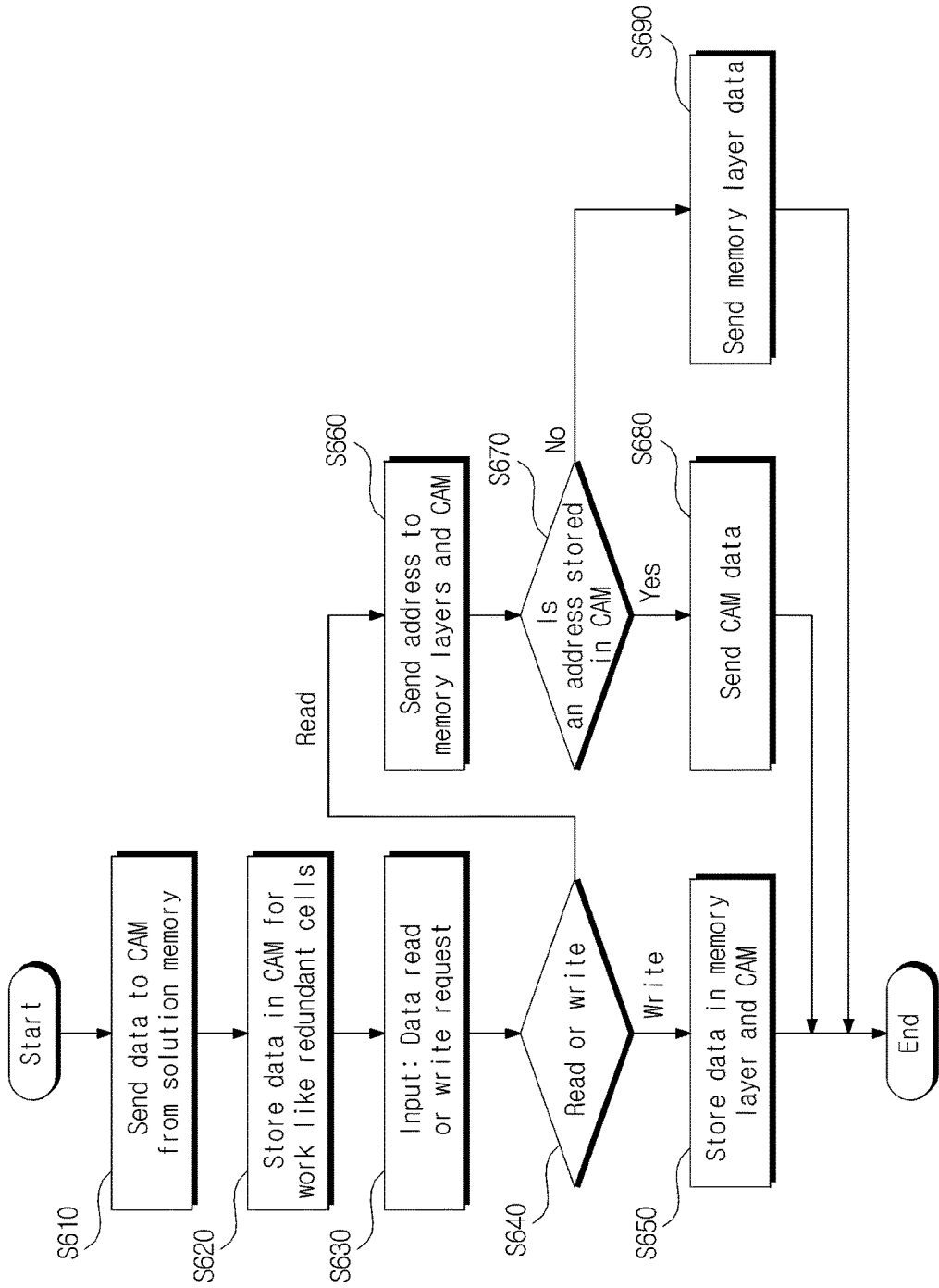
[FIG. 6]

[FIG. 7]
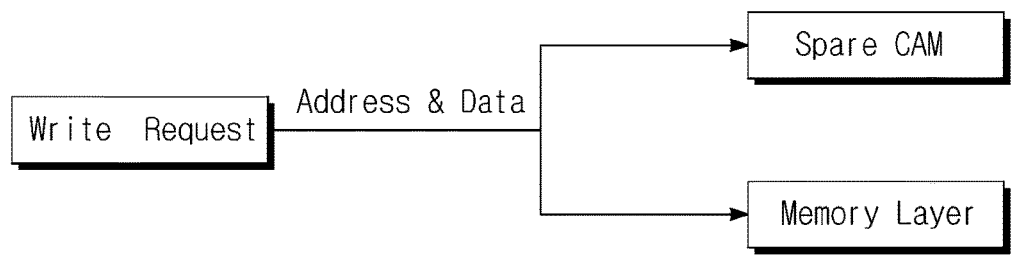
[FIG. 8]
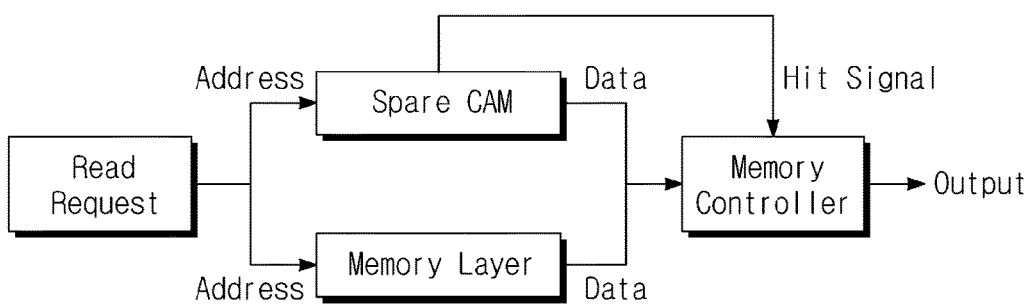

[FIG. 9]
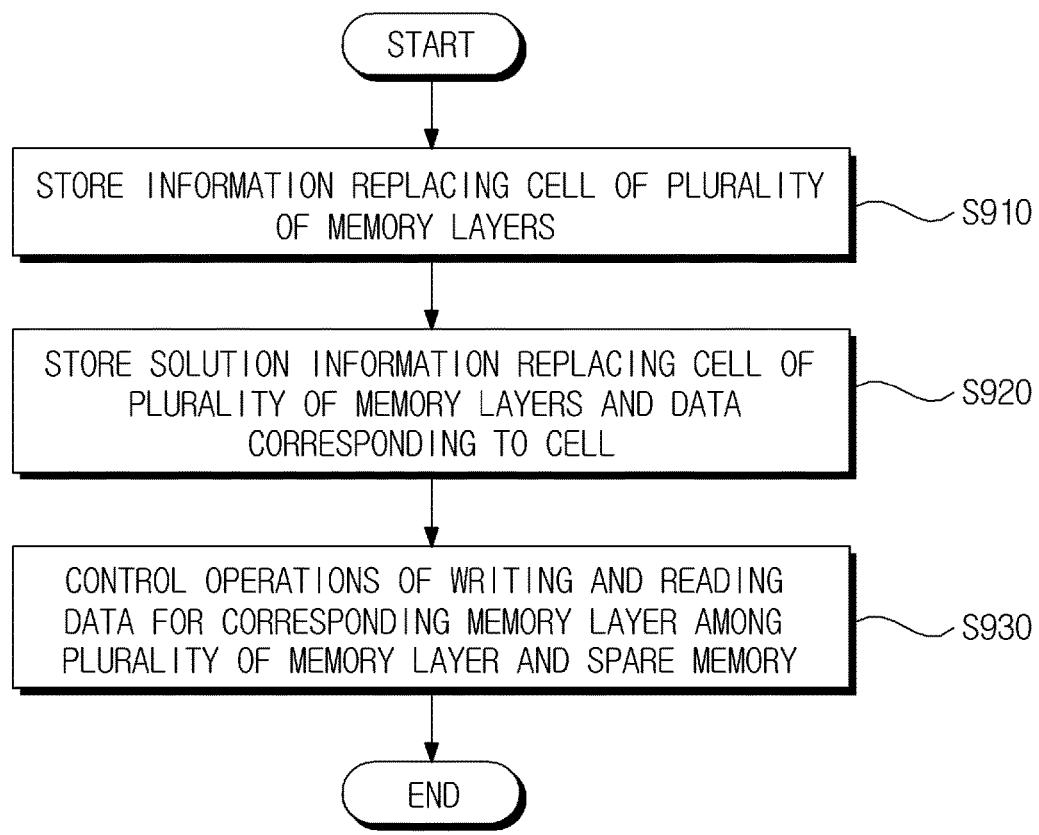

STACKED MEMORY DEVICE USING BASE DIE SPARE CELL AND METHOD OF REPAIRING THE SAME

CROSS-REFERENCE TO RELATED APPLICATIONS

This application claims priority to and the benefit of Korean Patent Application No. 10-2017-0170045 filed in the Korean Intellectual Property Office on Dec. 12, 2017, the entire contents of which are incorporated herein by reference.

TECHNICAL FIELD

The technical field to which the present exemplary embodiment belongs relates to a method of repairing a stacked memory device. This research was conducted as a research result of the future semiconductor device fundamental technology development program supported by the Ministry of Trade, Industry & Energy (MOTIE, 10052875) and Korea Semiconductor Research Consortium (KSRC) (No. 2017-11-1235).

BACKGROUND ART

Contents described herein simply provide background information about the present exemplary embodiment, but do not configure the related art.

As a three-dimensional memory in which a layer of a memory is stacked is developed from a two-dimensional memory, a high repair rate is demanded compared to the existing memory. The reason is that when it fails to repair even one layer in a three-dimensional memory, a whole memory needs to be discarded.

In the existing three-dimensional memory, a spare cell is provided in each layer. The spare cells are divided into spare cells for a pre-bond repair process that is a repair process on a wafer and spare cells for a post-bond repair process that is a repair process after a memory is stacked.

A memory die used for manufacturing a three-dimensional memory uses a shared spare cell, so that the memory die may be classified into a fault free die after a pre-bond text and repair process, a self-repairable die, an inter-repairable die (repairable die using a shared spare cell), and an irreparable die. The fault free die does not have a fault in a die, and does not use a share cell at all. In the self-repairable die, all of the faults within a die may be repaired by using an autonomously embedded spare cell, but in the repairable die using a shared spare cell, it is impossible to repair a die by using only an autonomous embedded spare cell, so that a spare cell of an adjacent die needs to be additionally used. The irreparable die is a die which cannot be repaired even by sharing and using a spare cell of an adjacent die, as well as an autonomous embedded spare cell. The classified die is matched by expecting an additional fault generable during a bond process. Availability of the matching completed three-dimensional memory is determined after passing the post-bond test and repair process.

SUMMARY OF THE INVENTION

A main object of the exemplary embodiments of the present invention is to solve time wasted during an approach to a memory layer after a spare memory performs determination and secure a high repair rate by disposing spare cells for a post-bond test and repair process in a base die and using the spare cells in each memory layer as many as the number desired, and simultaneously approaching the spare cell of the base die and the memory layer and selecting meaningful data.

Another object of the exemplary embodiments of the present invention is to eliminate the need to newly perform a test even though power of a memory is blocked and secure a high repair rate by disposing spare cells for a post-bond test and repair process in a base die and using the spare cells in each memory layer as many as the number desired, and permanently storing a repair result after the test.

Other non-specified objects of the present invention may be additionally considered within a range easily derivable on the basis of the detailed description and the effect thereof below.

An exemplary embodiment of the present invention provides a stacked memory device, including: a plurality of memory layers; and a system layer connected to the plurality of memory layers, in which the system layer includes: a solution memory which stores solution information replacing a cell of the plurality of memory layers; a spare memory which stores the solution information replacing the cell of the plurality of memory layers and data corresponding to the cell; and a memory controller which controls an operation of writing data and an operation of reading data for a corresponding memory layer among the plurality of memory layers and the spare memory.

Another exemplary embodiment of the present invention provides a method of repairing a stacked memory device which includes a plurality of memory layers and a system layer, the method including: storing, by a solution memory, solution information replacing a cell of the plurality of memory layers; storing, by a spare memory, the solution information replacing the cell of the plurality of memory layers and data corresponding to the cell; and controlling, by a memory controller, an operation of writing data and an operation of reading data for a corresponding memory layer among the plurality of memory layers and the spare memory.

As described above, according to the exemplary embodiments of the present invention, it is possible to solve time wasted during an approach to a memory layer after a spare memory performs determination and secure a high repair rate by disposing spare cells for a post-bond test and repair process in a base die and using the spare cells in each memory layer as many as the number desired, and simultaneously approaching the spare cell of the base die and the memory layer and selecting meaningful data.

According to the exemplary embodiments of the present invention, it is possible to eliminate the need to newly perform a test even though power of a memory is blocked and secure a high repair rate by disposing spare cells for a post-bond test and repair process in a base die and using the spare cells in each memory layer as many as the number desired, and permanently storing a repair result after the test.

Although not explicitly stated herein, the effects described in the specification below expected by the technical characteristics of the present invention and the provisional effects thereof are treated as the effects described in the specification of the present invention.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 1 is a diagram illustrating an example of a structure of a stacked memory device according to an exemplary embodiment of the present invention.

FIG. 2 is a block diagram illustrating an example of a system layer of the stacked memory device according to the exemplary embodiment of the present invention.

FIG. 3 is a diagram illustrating an example of a signal flow of the system layer of the stacked memory device according to the exemplary embodiment of the present invention.

FIG. 4 is a flow chart illustrating an example of an operation of setting a solution memory of the stacked memory device according to the exemplary embodiment of the present invention.

FIG. 5 is a block diagram illustrating an example of a memory controller of the stacked memory device according to the exemplary embodiment of the present invention.

FIG. 6 is a flow chart illustrating an example of an operation of processing data by the memory controller of the stacked memory device according to the exemplary embodiment of the present invention.

FIG. 7 is a diagram illustrating an example of an operation of writing data by the memory controller of the stacked memory device according to the exemplary embodiment of the present invention.

FIG. 8 is a diagram illustrating an example of an operation of reading data by the memory controller of the stacked memory device according to the exemplary embodiment of the present invention.

FIG. 9 is a flow chart illustrating an example of a method of repairing the stacked memory device according to another exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, in the description of the present invention, a detailed description of known functions incorporated herein is obvious to those skilled in the art and will be omitted to avoid making the subject matter of the present invention unclear, and some exemplary embodiments of the present invention will be described in detail with reference to the illustrative drawings.

FIG. 1 is a diagram illustrating an example of a structure of a stacked memory device. The stacked memory device means a three-dimensional computer memory including one or more combined memory die layers, memory packages, or other memory elements. Referring to FIG. 1, the stacked memory device 10 may include a plurality of memory layers 100 and a system layer 200, and may be implemented on a substrate.

The stacked memory device 10 may include memory elements which are vertically stacked or horizontally stacked (for example, side-by side), or are combined with each other. The plurality of memory layers 100 may be implemented by a dynamic random access memory (DRAM), but is not limited thereto. By an emergence of a stacked DRAM Standard (Wide IO), a DRAM wafer may be stacked on the same package including a memory stack together with a system element, such as a system on chip (SoC) wafer. In the stacked memory device, memory layers may be varied for each device depending on a manufacturing company of a DRAM.

The plurality of memory layers 100 may be connected with each other through a through silicon via (TSV) 150. The stacked memory uses TSV manufacturing schemes, and in order to provide signal paths through a memory stack, vias are generated through silicon dies. When the plurality of memory layers 100 is connected through the through silicon via, the topmost (or the outermost) memory die layer may be excluded.

The system layer 200 may include elements, such as a central processing unit (CPU), a memory controller, and other relevant system elements. The system layer may include an SoC. A logic chip may be an application processor or a graphic processing unit (GPU).

A memory repair is applicable to a predetermined memory format comprehensive and performed by a memory manufacturing company. In some exemplary embodiments, the memory device may store addresses of faulty portions of the memory in a separate memory, such as a content addressable memory (CAM), or convert addresses of faulty portions of the memory into faultless portions of the memory to provide redundancy for the faulty elements. In some exemplary embodiments, spare rows, columns, or blocks of the faulty memory may be implemented in the predetermined DRAMs in the related art.

FIG. 2 is a block diagram illustrating an example of the system layer of the stacked memory device according to the exemplary embodiment of the present invention, and FIG. 3 is a diagram illustrating an example of a signal flow of the system layer of the stacked memory device.

Referring to FIG. 2, the system layer 200 includes a solution memory 210, a spare memory 220, and a memory controller 230. In the system layers 200, some constituent elements among the various constituent elements illustrated in FIG. 2 may be omitted or other constituent elements may be additionally included.

The solution memory 210 stores solution information replacing the cells of the plurality of memory layers. The solution memory 210 is a non-volatile memory, and permanently stores solution information. The solution memory 210 may be implemented by a NAND flash memory, but this is simply an example, and the solution memory 210 is not limited thereto.

The spare memory 220 may receive solution information from the solution memory 210 and operate like a spare cell whenever power is applied. The spare memory 220 stores solution information replacing the cells of the plurality of memory layers and data corresponding to a cell. The spare memory is a volatile memory, and may be implemented by a static random access memory (SRAM) or a CAM, but this is a simple example, and the spare memory is not limited thereto. When power is applied, the spare memory 220 receives solution information from the solution memory 210 and logically replaces the cell of the plurality of memory layers without adding a spare cell to the plurality of memory layers. That is, the spare memory 220 performs a logical replacement operating like a matrix corresponding to a memory layer, not a physical replacement.

The memory controller 230 controls an operation of writing data and an operation of reading data with respect to a corresponding memory layer and a spare memory among the plurality of memory layers.

Referring to FIG. 3, the solution memory may store (i) layer information, (ii), a matrix flag, and (iii) a row or column address replacing a line of the plurality of memory layers. The memory layer operates by a scheme of reading information of a whole line and selecting necessary information among the read information. In this case, the solution memory requires a size as large as the number of bits obtained by summing the number of bits for layer information, the number of bits meaning a row or a column, or the number of bits for a row or column address. That is, the solution memory requires Enable+Log (Layer)+Log (Max (R, C))+(R/C Descript) bits. Herein, R means a row and C means a column.

The spare memory may store (i) layer information, (ii), a matrix flag, (iii) a row or column address, and (iv) data corresponding to a line replacing a line of the plurality of memory layers. In this case, one line of the spare memory replaces one line of the memory layer. The spare memory requires a size as large as the number of bits obtained by summing the number of bits for layer information in one direction, the number of bits meaning a row or a column, the number of bits for a row or column address, and the number of bits for data of the replaced whole line. That is, the spare memory requires Enable+Log (Layer)+Log (Max(R, C))+ (R/C Descript)+Spare Line bits. The spare memory requires the size as large as the number of bits obtained by multiplying a spare row and a spare column by the number of layers in another direction. That is, the spare memory requires Layer×(Rs+Cs) bits. Herein, Rs means a spare row and Cs means a spare column.

In the present exemplary embodiment, one cell, not a whole line, may be replaced. The solution information may indicate (i) layer information, (ii), row information, and (iii) column information, and the solution memory may store (i) layer information, (ii), row information, and (iii) column information replacing the line of the plurality of memory layers. The solution memory has all of the new matrix information, that is, entire coordinates of the replaced cell. The spare memory also has all matrix information, the entire memory line is not input to a data position, but data having a data size indicated by one cell is stored in the spare memory.

Hereinafter, an operation of setting the solution memory by the stacked memory device will be described with reference to FIG. 4.

In operation S410, the stacked memory device examines a memory layer by using automatic test equipment (ATE) and acquires fault data. In operation S420, the stacked memory device collects the fault data. In operation S430, the stacked memory device analyzes the fault data by using the ATE and obtains a replacement solution.

The ATE is equipment automatically examining the stacked memory device, that is, a device under test (DUT), and is formed of a microcomputer or a microprocessor-based system. The ATE is electrically combined with a built off self-test (BOST) circuit device through a test header. The ATE may directly input a test pattern to a DUT or may be electrically connected with a DUT through a BOST circuit device and input a test pattern to the DUT. The ATE compares an output and an expected value of the DUT and determines an error of the DUT. The DUT may be mounted to a socket of the BOST circuit device to be electrically coupled to the BOST circuit device.

The ATE may be connected with an external server by using an interface. The server provides a user interface and provides an environment in which a user is capable of writing a test program appropriate to a characteristic of a DUT to be tested. Further, the server may provide a user interface in which the test program is transmitted to the ATE and a test result is received from the ATE to analyze the test result. The server may be the predetermined type of processing device, and includes a personal computer (PC), a desktop device, a portable device, a microprocessor computer, a microprocessor-based or programmable consumer electronic device, a mini computer, a main frame computer, and/or a personal mobile computing device in the related art, but is not limited thereto.

The BOST circuit device may be formed of a printed circuit board, and may be formed of a plurality of conductive patterns for electrically connecting the ATE and the DUT. The plurality of conductive patterns may include input/output test signal lines, clock signal lines, and power lines. The BOST circuit device may include a test board or a high fidelity tester access fixture (HI FIX).

In operation S440, the stacked memory device stores solution information in the solution memory. Herein, the solution information may be (i) layer information, row information, and column information for replacing a cell or (ii) layer information, a matrix flag, and a row or column address for replacing a line. In operation S450, operations S410 to S440 are repeatedly performed on the entire memory layers. When the large amount of spare cells are inserted into the base die, and the number of spare cells used as a solution after the progress of the test is within the number of spare cells for the post-bond repair process inserted to the whole memory, regardless of the number of spare cells for each layer, it is possible to repair the memory device.

Hereinafter, operation of reading and writing data by the stacked memory device will be described with reference to FIGS. 5 to 8. FIG. 5 is a block diagram illustrating an example of the memory controller of the stacked memory device, and FIG. 6 is a flow chart illustrating an example of an operation of processing data by the memory controller of the stacked memory device.

In operation S610, the stacked memory device transmits the solution information stored in the solution memory to a spare memory. In operation S620, the stacked memory device stores the solution information in the spare memory so that the spare memory operates like a spare cell. The spare memory operates with an address. In operation S630, the stacked memory device receives a request for a data writing or reading operation. In operation S640, the stacked memory device has different operations for read and write processes.

It is difficult to share the memory layer in the memory repair because of a difference between an operation rate of a normal memory cell and a rate of a repaired cell. The stacked memory device according to the present exemplary embodiment requests information from both the spare memory and the memory layer. Then, the stacked memory device determines whether to use data of the spare memory or data of the memory layer depending on existence of an address in the spare memory. Since information confirmation of the spare memory is faster than that of the memory layer, a determination on whether to transmit the information of the spare memory or the information of the memory is already completed before a result value of the normal memory cell arrives.

In operation S650, the memory controller controls the information to be transmitted to both the spare memory and the memory layer during the write operation of the memory. When a corresponding address does not exist, the spare memory does not store data, and when a corresponding address exists, the spare memory stores data. The memory layer stores the information regardless of a faulty cell or a normal cell. Then, data is selected during the read operation.

In operation S660, when the address is input during the read operation of the memory, the memory controller controls the information to be transmitted to both the spare memory and the memory layer. In operation S670, the spare memory determines whether the corresponding address exists therein. When the spare memory has the corresponding address, the address is the replaced address, so that the memory controller selects and transmits the data of the spare memory in operation S680, and when the spare memory does not have the corresponding address, a cell normally operates, so that the memory controller selects and transmits the data of the memory layer in operation S690.

FIG. 7 is a diagram illustrating an example of an operation of writing data by the memory controller. When the memory controller performs an operation of writing data to a target address, the memory controller transmits the target address and the data to both the memory layer corresponding to the target address among the plurality of memory layers and the spare memory.

The memory layer corresponding to the target address stores the transmitted data regardless of a fault of the cell, and when the target address exists, the spare memory stores the transmitted data, and when the target address does not exist, the spare memory does not store the transmitted data.

That is, during the write operation, both the spare memory and the memory operate. At a position of the normally operating cell, the spare memory has no address, so that nothing happens. The memory performs the write operation. However, in the case of the faulty cell, the spare memory performs the write operation, and the memory performs the write operation because of the faulty cell, but nothing happens.

FIG. 8 is a diagram illustrating an example of an operation of reading data by the memory controller. When the memory controller performs an operation of reading data from a target address, the memory controller transmits the target address to both a memory layer corresponding to the target address among the plurality of memory layers and a spare memory.

When the target address exists in the spare memory, the memory controller selects data corresponding to the target address in the spare memory and outputs the selected data, and when the target address does not exist in the spare memory, the memory controller selects data corresponding to the target address in the memory layer corresponding to the target address and outputs the selected data.

That is, the memory controller transmits the address to both the spare memory and the memory during the read operation. Then, the spare memory determines whether the corresponding address exists therein. When the address exists in the spare memory, the address is the address of the faulty cell, so that information stored in the spare memory is output. However, when the address does not exist in the spare memory, the address is the address of the normal cell, so that information stored in the memory is output.

In the stacked memory device according to the present exemplary embodiment, inter-layer sharing in the entire layers is available. When an address is assigned to the spare memory in order to use a spare, the stacked memory device may use the spare as many as the number desired by each memory layer. As long as the quantity of spare cells used as a repair solution is not larger than a capacity of the inserted spare memory, it is possible to repair abnormality of the memory device. That is, the present invention has an advantage in that it is possible to repair even the memories that cannot be repaired by the existing scheme.

The spare memory operates as a spare cell only by assigning a new address to the spare memory, so that when a capacity of the spare memory inserted to the entire memory is allowed regardless of a position of the layer, it is possible to secure the spare cells as many as the number desired by each layer. The memory structure does not mean that one layer uses the optimum spare cells, but means that the entire memory uses the optimum spare cells.

The plurality of constituent elements included in the stacked memory device may be combined with one another to be implemented as at least one module. The constituent elements are connected to a communication path connecting a software module or a hardware module inside a device and organically operate with one another. The constituent elements communicate by using one or more communication buses or signal lines.

The stacked memory device may be implemented within a logic circuit by hardware, firmware, software, or a combination thereof, and may also be implemented by a universal or specific purpose computer. The device may be implemented by a hardwired device, a field programmable gate array (FPGA), an application specific integrated circuit (ASIC), and the like. Further, the device may be implemented by a system on chip (SoC) including one or more processors and controllers.

The stacked memory device may be mounted in the form of software, hardware, or a combination thereof on a computing device on which hardware elements are provided. The computing device may mean various devices including the entirety or a part of a communication device, such as a communication modem, for performing communication with various devices or a wired/wireless communication network, a memory storing data for executing a program, and a microprocessor for executing a program and performing a calculation and giving a command.

FIG. 9 is a flow chart illustrating an example of a method of repairing the stacked memory device according to another exemplary embodiment of the present invention. The method of repairing the stacked memory device may be performed by the stacked memory device.

In operation S910, a solution memory of the stacked memory device stores solution information replacing a cell of the plurality of memory layers. In operation S920, the spare memory of the stacked memory device stores the solution information replacing the cell of the plurality of memory layers and data corresponding to the cell. The solution memory is implemented by a non-volatile memory, the spare memory is implemented by a volatile memory, and a data processing rate of the spare memory is higher than a data processing rate of the memory layer. For example, the spare memory may be implemented by a CAM.

The solution memory permanently stores solution information, and when power is applied, the spare memory receives the solution information from the solution memory and logically replaces the cell of the plurality of memory layers without adding the spare cell to the plurality of memory layers.

The solution information may be layer information, row information, and column information. The solution memory may store layer information, a matrix flag, and a row or column address replacing a line of the plurality of memory layers, and the spare memory may store layer information, a matrix flag, and a row or column address replacing a line of the plurality of memory layers, and data corresponding to the line.

In operation S930, the memory controller of the stacked memory device controls the operation of writing data and an operation of reading data for the corresponding memory layer among the plurality of memory layers and the spare memory.

When the memory controller performs the operation of writing data to a target address, the memory controller transmits the target address and the data to both the memory layer corresponding to the target address among the plurality of memory layers and the spare memory. The memory layer corresponding to the target address stores the transmitted data regardless of a fault of the cell, and the spare memory stores the transmitted data when the target address exists, and does not store the transmitted data when the target address does not exist.

When the memory controller performs an operation of reading data from a target address, the memory controller transmits the target address to both a memory layer corresponding to the target address among the plurality of memory layers and a spare memory. When the target address exists in the spare memory, the memory controller selects data corresponding to the target address in the spare memory and outputs the selected data, and when the target address does not exist in the spare memory, the memory controller selects data corresponding to the target address in the memory layer corresponding to the target address and outputs the selected data.

According to the repair method of the present exemplary embodiment, it is possible to improve a repair rate or a normalized repair rate that is a value obtained by dividing the number of repaired chips by the number of faulty chips.

In FIGS. 4, 6, and 9, it is described that the respective processes are sequentially executed, which is, however, illustrative, and those skilled in the art may change and execute the order described in FIGS. 4, 6, and 9 or may variously correct and modify the order described in FIGS. 4, 6, and 9, such as executing one or more processes in parallel or adding another process, and apply the corrected and modified order within the range of the essential characteristic of the exemplary embodiment of the present invention.

Meanwhile, the embodiments according to the present invention may be implemented in the form of program instructions that can be executed by computers, and may be recorded in computer readable media. The computer readable media may include program instructions, a data file, a data structure, or a combination thereof. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A stacked memory device, comprising:
   a plurality of memory layers; and
   a system layer connected to the plurality of memory layers,
   wherein the system layer includes:
   a solution memory which stores solution information replacing a cell of the plurality of memory layers;
   a spare memory which stores the solution information replacing the cell of the plurality of memory layers and data corresponding to the cell; and
   a memory controller which controls an operation of writing data and an operation of reading data for a corresponding memory layer among the plurality of memory layers and the spare memory,
   wherein the solution memory is a non-volatile memory that permanently stores the solution information,
   wherein the spare memory is a volatile memory that receives the solution information from the solution memory and logically replaces the cell of the plurality of memory layers without adding a spare cell to the plurality of memory layers, when power is applied, and
   wherein a data processing rate of the spare memory is higher than a data processing rate of the memory layers.

2. The stacked memory device of claim 1, wherein the spare memory is implemented by a content addressable memory (CAM).

3. The stacked memory device of claim 1,
   wherein the memory layers store data regardless of a faulty cell or a normal cell, the data being selected during the read operation, and
   wherein data confirmation of the spare memory is faster than data confirmation of the memory layers, and a determination on whether to transmit the data of the spare memory or the data of the memory layers is already completed before the data of the normal cell arrives.

4. The stacked memory device of claim 1, wherein the solution information is (i) layer information, (ii) row information, and (iii) column information.

5. The stacked memory device of claim 1, wherein the solution memory stores (i) layer information, (ii), a matrix flag, and (iii) a row or column address replacing a line of the plurality of memory layers, and
the spare memory stores (i) the layer information, (ii), the matrix flag, (iii) the row or column address, and (iv) the data corresponding to the line replacing the line of the plurality of memory layers.

6. The stacked memory device of claim 3, wherein when the memory controller performs an operation of writing data to a target address, the memory controller transmits the target address and the data to both a memory layer corresponding to the target address among the plurality of memory layers and the spare memory.

7. The stacked memory device of claim 6, wherein the memory layer corresponding to the target address stores the transmitted data regardless of a fault of the cell, and
the spare memory stores the transmitted data when the target address exists, and the spare memory does not store the transmitted data when the target address does not exist.

8. The stacked memory device of claim 3, wherein when the memory controller performs an operation of reading data from a target address, the memory controller transmits the target address to both a memory layer corresponding to the target address among the plurality of memories and the spare memory.

9. The stacked memory device of claim 8, wherein when the target address exists in the spare memory, the memory controller selects data corresponding to the target address from the spare memory and outputs the selected data, and when the target address does not exist in the spare memory, the memory controller selects data corresponding to the target address from the memory layer corresponding to the target address and outputs the selected data.

10. A method of repairing a stacked memory device which includes a plurality of memory layers and a system layer, the method comprising:
storing, by a solution memory, solution information replacing a cell of the plurality of memory layers;
storing, by a spare memory, the solution information replacing the cell of the plurality of memory layers and data corresponding to the cell; and
controlling, by a memory controller, an operation of writing data and an operation of reading data for a corresponding memory layer among the plurality of memory layers and the spare memory,
wherein the solution memory is a non-volatile memory that permanently stores the solution information,
wherein the spare memory is a volatile memory that receives the solution information from the solution memory and logically replaces the cell of the plurality of memory layers without adding a spare cell to the plurality of memory layers, when power is applied, and
wherein a data processing rate of the spare memory is higher than a data processing rate of the memory layers.

11. The method of claim 10, wherein the spare memory is implemented by a content addressable memory (CAM).

12. The method of claim 10,
wherein the memory layers stores the data regardless of a faulty cell or a normal cell, the data is selected during the read operation, and
wherein data confirmation of the spare memory is faster than data confirmation of the memory layer, a determination on whether to transmit the date of the spare memory or the data of the memory layers is already completed before the data of the normal cell arrives.

13. The method of claim 10, wherein the solution information is (i) layer information, (ii) row information, and (iii) column information.

14. The method of claim 10, wherein the solution memory stores (i) layer information, (ii), a matrix flag, and (iii) a row or column address replacing a line of the plurality of memory layers, and
the spare memory stores (i) the layer information, (ii), the matrix flag, (iii) the row or column address, and (iv) the data corresponding to the line replacing the line of the plurality of memory layers.

15. The method of claim 12, wherein when the memory controller performs an operation of writing data to a target address, the memory controller transmits the target address and the data to both a memory layer corresponding to the target address among the plurality of memory layers and the spare memory.

16. The method of claim 15, wherein the memory layer corresponding to the target address stores the transmitted data regardless of a fault of the cell, and
the spare memory stores the transmitted data when the target address exists, and the spare memory does not store the transmitted data when the target address does not exist.

17. The method of claim 12, wherein when the memory controller performs an operation of reading data from a target address, the memory controller transmits the target address to both a memory layer corresponding to the target address among the plurality of memory layers and the spare memory.

18. The method of claim 17, wherein when the target address exists in the spare memory, the memory controller selects data corresponding to the target address from the spare memory and outputs the selected data, and when the target address does not exist in the spare memory, the memory controller selects data corresponding to the target address from the memory layer corresponding to the target address and outputs the selected data.

* * * * *